United States Patent
Nozoe et al.

(10) Patent No.: US 7,394,070 B2
(45) Date of Patent: Jul. 1, 2008

(54) METHOD AND APPARATUS FOR INSPECTING PATTERNS

(75) Inventors: Mari Nozoe, Hino (JP); Yasunori Goto, Hitachinaka (JP); Zhaohui Cheng, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 114 days.

(21) Appl. No.: 11/314,020

(22) Filed: Dec. 22, 2005

(65) Prior Publication Data

US 2006/0163477 A1   Jul. 27, 2006

(30) Foreign Application Priority Data

Dec. 27, 2004   (JP)   ............................. 2004-377778

(51) Int. Cl.
*G01N 23/00* (2006.01)
*G21K 7/00* (2006.01)
*G21K 5/10* (2006.01)

(52) U.S. Cl. ................. 250/310; 250/306; 250/307; 250/311; 250/492.2; 250/492.3

(58) Field of Classification Search ................. 250/310
See application file for complete search history.

(56) References Cited

U.S. PATENT DOCUMENTS

| | | | |
|---|---|---|---|
| 5,502,306 | A | 3/1996 | Meisburger et al. |
| 6,472,663 | B2 * | 10/2002 | Nagaoki et al. ............. 250/311 |
| 6,512,227 | B2 * | 1/2003 | Iwabuchi et al. ............. 250/310 |
| 6,538,249 | B1 * | 3/2003 | Takane et al. ............... 250/310 |
| 7,045,781 | B2 * | 5/2006 | Adamec et al. ............. 250/310 |

(Continued)

FOREIGN PATENT DOCUMENTS

JP   03-167456   7/1991

(Continued)

OTHER PUBLICATIONS

Meisburger, W.D. et al.: "Low-voltage electron-optical system for the high-speed inspection of integrated circuits," Journal of Vacuum Science Technology, B vol. 10, No. 6, 1992, pp. 2804-2808.

(Continued)

*Primary Examiner*—David A. Vanore
*Assistant Examiner*—Bernard Souw
(74) *Attorney, Agent, or Firm*—McDermott Will & Emery LLP

(57) ABSTRACT

When the electrode potential of a charge control electrode above a wafer is reduced, image brightness is reduced. A point of change in the image brightness is a switching point between a positively charged state of the image and a negatively charged state of the image, showing the weakly charged state of the image. By setting this point of change as an inspecting condition, the amount of electric charges on the surface of the wafer can be reduced, and stable wafer inspection can be performed. It is estimated that an applied voltage V1 in FIG. 14 corresponds to the point of the change and is roughly included in the voltage range of a region enclosed by a broken line in the vicinity of the applied voltage V1. Within this voltage range, the influence of charge on an inspection under the inspecting condition can be reduced.

14 Claims, 12 Drawing Sheets

U.S. PATENT DOCUMENTS

| | | | |
|---|---|---|---|
| 7,049,585 B2 * | 5/2006 | Nakasuji et al. | 250/310 |
| 7,112,792 B2 * | 9/2006 | Agemura et al. | 250/310 |
| 7,223,975 B2 * | 5/2007 | Nara et al. | 250/310 |
| 2003/0206027 A1 * | 11/2003 | Nozoe et al. | 324/751 |
| 2006/0151700 A1 * | 7/2006 | Honda et al. | 250/310 |
| 2006/0163477 A1 * | 7/2006 | Nozoe et al. | 250/310 |
| 2006/0163480 A1 * | 7/2006 | Koyama et al. | 250/310 |
| 2007/0057183 A1 * | 3/2007 | Arai et al. | 250/310 |

FOREIGN PATENT DOCUMENTS

| | | |
|---|---|---|
| JP | 05-258703 | 10/1993 |
| JP | 09-138198 | 5/1997 |
| JP | 10-234543 | 9/1998 |

OTHER PUBLICATIONS

Electron and Ion Beams Handbook, The Nikkan Kogyo Shimbun, Ltd., pp. 622-623, Japan.

Meisburger, W.D. et al.: "Requirements and performance of an electron-beam column designed for x-ray mask inspection," Journal of Vacuum Science Technology, B vol. 9, No. 6, 1991, pp. 3010-3014.

Semiconductor World, Aug. 1995, pp. 96-99, Japan.

Meisburger et al.; "Low-Voltage Electron-Optical System for the High-Speed Inspection of Integrated Circuits";*Journal of Vacuum Science& Technology B*; c. 1992; vol. 10, No. 6; Second Series; pp. 2804-2808.

* cited by examiner

| | | | | | | | | | |
|---|---|---|---|---|---|---|---|---|---|
| 2.78E+06 | 2.80E+06 | 2.94E+06 | 3.06E+06 | 3.04E+06 | 3.19E+06 | 1.37E+09 | 2.97E+06 | 2.85E+06 | 1.09E+09 | 3.23E+06 | 3.37E+06 | 3.44E+06 | 3.52E+06 | 2.84E+06 | 2.96E+06 |
| 2.78E+06 | 2.80E+06 | 3.01E+06 | 3.06E+06 | 3.12E+06 | 3.21E+06 | 2.94E+06 | 2.98E+06 | 2.90E+06 | 2.96E+06 | 3.30E+06 | 3.38E+06 | 3.49E+06 | 3.52E+06 | 2.90E+06 | 2.96E+06 |
| 2.79E+06 | 2.79E+06 | 3.04E+06 | 3.06E+06 | 3.16E+06 | 3.22E+06 | 2.96E+06 | 5.95E-08 | 2.93E+06 | 2.97E+06 | 3.34E+06 | 3.39E+06 | 3.51E+06 | 3.51E+06 | 2.94E+06 | 2.94E+06 |
| 2.81E+06 | 2.84E+06 | 1.45E-09 | 2.89E+06 | 3.18E+06 | 3.29E+06 | 3.06E+06 | 3.22E+06 | 2.98E+06 | 3.18E+06 | 3.31E+06 | 3.44E+06 | 3.45E+06 | 3.52E+06 | 2.90E+06 | 2.94E+06 |
| 2.82E+06 | 2.84E+06 | 2.87E+06 | 2.87E+06 | 3.24E+06 | 3.28E+06 | 3.13E+06 | 3.24E+06 | 3.06E+06 | 3.22E+06 | 3.38E+06 | 3.45E+06 | 3.50E+06 | 3.51E+06 | 2.92E+06 | 2.93E+06 |
| 2.84E+06 | 2.84E+06 | 2.89E+06 | 2.86E+06 | 3.28E+06 | 3.27E+06 | 3.19E+06 | 3.26E+06 | 3.12E+06 | 3.26E+06 | 3.43E+06 | 3.45E+06 | 3.52E+06 | 3.48E+06 | 2.94E+06 | 2.90E+06 |
| 2.80E+06 | 2.82E+06 | 2.93E+06 | 3.00E+06 | 3.21E+06 | 3.34E+06 | 3.02E+06 | 3.18E+06 | 3.03E+06 | 3.22E+06 | 3.39E+06 | 3.52E+06 | 3.35E+06 | 3.42E+06 | 2.86E+06 | 2.89E+06 |
| 2.81E+06 | 2.82E+06 | 2.97E+06 | 2.99E+06 | 3.28E+06 | 3.34E+06 | 3.09E+06 | 3.22E+06 | 3.10E+06 | 3.26E+06 | 3.46E+06 | 3.53E+06 | 3.41E+06 | 3.39E+06 | 2.88E+06 | 2.88E+06 |
| 2.81E+06 | 2.80E+06 | 3.00E+06 | 2.97E+06 | 5.46E-09 | 3.33E+06 | 3.14E+06 | 3.23E+06 | 3.17E+06 | 3.29E+06 | 3.50E+06 | 3.54E+06 | 3.43E+06 | 3.36E+06 | 2.89E+06 | 2.86E+06 |
| | | 2.80E+06 | 2.81E+06 | 3.00E+06 | 3.05E+06 | 3.26E+06 | 3.36E+06 | 3.34E+06 | 3.44E+06 | 3.38E+06 | 3.40E+06 | 3.10E+06 | 3.07E+06 | | |
| | | 2.80E+06 | 2.81E+06 | 3.04E+06 | 3.02E+06 | 3.31E+06 | 3.34E+06 | 3.39E+06 | 3.42E+06 | 3.41E+06 | 3.37E+06 | 3.11E+06 | 3.02E+06 | | |
| | | 2.81E+06 | 2.80E+06 | 3.06E+06 | 2.98E+06 | 3.35E+06 | 3.32E+06 | 3.43E+06 | 3.41E+06 | 3.33E+06 | 3.39E+06 | 3.10E+06 | 2.97E+06 | | |
| | | 4.53E-08 | 2.82E+06 | 3.10E+06 | 3.16E+06 | 3.30E+06 | 3.41E+06 | 3.36E+06 | 3.45E+06 | 3.37E+06 | 3.39E+06 | 2.96E+06 | 2.96E+06 | | |
| | | 2.81E+06 | 2.81E+06 | 3.15E+06 | 3.14E+06 | 3.35E+06 | 3.41E+06 | 3.41E+06 | 3.45E+06 | 3.39E+06 | 3.35E+06 | 2.99E+06 | 2.94E+06 | | |
| | | 2.82E+06 | 2.80E+06 | 3.17E+06 | 3.09E+06 | 3.39E+06 | 3.38E+06 | 3.45E+06 | 3.42E+06 | 3.41E+06 | 3.30E+06 | 2.99E+06 | 2.90E+06 | | |
| | | | | 6.68E+09 | 2.82E+06 | 2.89E+06 | 2.88E+06 | 2.96E+06 | 2.92E+06 | 2.89E+06 | 2.91E+06 | | | | |
| | | | | 2.81E+06 | 2.82E+06 | 2.89E+06 | 2.87E+06 | 2.96E+06 | 2.89E+06 | 2.90E+06 | 2.90E+06 | | | | |
| | | | | 2.82E+06 | 2.82E+06 | 2.89E+06 | 2.85E+06 | 2.95E+06 | 2.87E+06 | 2.91E+06 | 2.88E+06 | | | | |
| | | | | 2.83E+06 | 2.84E+06 | 2.93E+06 | 2.91E+06 | 2.96E+06 | 2.94E+06 | 2.88E+06 | 2.89E+06 | | | | |
| | | | | 2.83E+06 | 2.84E+06 | 2.92E+06 | 2.89E+06 | 2.97E+06 | 2.92E+06 | 2.88E+06 | 2.88E+06 | | | | |
| | | | | 2.84E+06 | 2.82E+06 | 2.91E+06 | 2.87E+06 | 2.95E+06 | 2.89E+06 | 2.89E+06 | 2.87E+06 | | | | |

8-1

9-1
9-2

DEFECT IN LOWER LAYER

METHOD AND APPARATUS FOR INSPECTING PATTERNS

CROSS-REFERENCE TO RELATED APPLICATION

The present application is relevant to U.S. patent application Ser. No. 11/311,278, filed Dec. 20, 2005 by Yuko Sasaki et al., based on Japanese Patent Application No. 2004-367153 filed on Dec. 20, 2004, the entire content of which is incorporated herein by reference.

BACKGROUND OF THE INVENTION

The present invention relates to an inspection technology for inspecting fine patterns in a semiconductor device, a photo mask, a liquid crystal device, and the like. More specifically, the invention relates to the inspection technology for inspecting circuit patterns floated on a wafer during the manufacturing step of the semiconductor device, using an electron beam.

The inspection technology for the semiconductor device, photo mask, and liquid crystal device having fine circuit patterns is a very important technology for improvement in a manufacturing yield thereof. An outline of the technology will be described below using the inspection technology for a semiconductor wafer as an example.

The semiconductor device and a liquid crystal display device, which will be hereinafter referred to as the semiconductor device, is manufactured by repeating the step of transferring a pattern formed on the photo mask on the semiconductor wafer using a lithography process and an etching process. Whether the lithography process, etching process, and other various processes are satisfactory or not and generation of foreign matter during the manufacturing process of the semiconductor device greatly affect the yield of the semiconductor device. It is therefore important to detect abnormality and occurrence of a fault early or in advance and feedback the result of detection to the manufacturing process. For this purpose, the method of inspecting a pattern on the semiconductor wafer during the manufacturing process has been traditionally carried out.

As the method of inspecting a defect that is present on a circuit pattern on the semiconductor wafer, a defect inspection apparatus that irradiates white light onto the semiconductor wafer, and makes comparison among the circuit patterns of the same type in a plurality of large integrated circuits (LSIs) using an optical image obtained by the irradiation has been proposed and put to practical use. As the inspection method that uses the optical image, for example, JP-A-3-167456 discloses a method in which an optically illuminated region on a substrate is imaged by a time delay integrating sensor, and the obtained image of the optically illuminated region is compared with design information input in advance, thereby detecting a defect.

JP-A-9-138198 discloses an inspection method in which laser light is irradiated onto the semiconductor wafer to detect diffracted light or scattered light, makes discrimination between the diffracted light from a regular circuit pattern and the scattered light from foreign matter or a defective portion of an irregular shape, thereby detecting the foreign matter or the defective portion alone.

With finer geometries of the circuit pattern, a more complicated shape of the circuit pattern, and diversification of materials, defect detection by the optical image has become difficult. Accordingly, a method in which an electron beam image having a higher definition than that of the optical image is used to make circuit pattern comparison, for inspection, has also been proposed. As a method of making pattern comparison for inspection using the electron beam, J. Vac. Sci. Tech. B, Vol. 9, No. 6, pp. 3005-3009 (1991), J. Vac. Sci. Tech. B, Vol. 10, No. 6, pp. 2804-2808 (1992), JP-A-5-258703, U.S. Pat. No. 5,502,306, and JP-A-10-234543 disclose the method in which the electron beam having an electron beam current of 10 nA or more, which is 100 times or more the electron beam current of an ordinary scanning electron microscope (SEM) is irradiated onto a conductive substrate such as an X-ray mask, one of secondary electrons, reflected electrons, and transmitted electrons that are generated by the irradiation are detected, and an image formed from a signal of the detected electrons is compared with an adjacent comparable pattern, thereby automatically detecting a defect.

The inspection method as described above will be referred to as an electron beam inspection method. In the electron beam inspection method, an image with a higher definition than that with an optical appearance inspection method or a laser inspection method can be obtained. Detection of minute foreign matter or a defect on a fine circuit pattern is thereby possible. In addition to that, it is also possible to detect conductivity or non/conductivity of the circuit pattern and an electric defect using potential contrast. The potential contrast indicates a surface potential difference which is caused by the influence of charge by electron beam irradiation and reflects the emission efficiency of the secondary electrons. The conductivity or non-conductivity of the circuit pattern and the electric defect such as a short circuit of wiring or a transistor is generated on the surface or the lower layer of the semiconductor wafer. The potential contrast and a technology that utilizes the potential contrast are described in the "Electron and Ion Beams Handbook" (THE NIKKAN KOGYO SHIMBUN, Ltd), pp 622-623.

By applying the optical appearance inspection, the optical inspection method, and the electron beam inspection method to various minute circuit patterns of the semiconductor device or the like, detection of various defects that could not be detected or discriminated by the shape of the semiconductor wafer surface as well as defects such as foreign matter and a defective pattern shape have become possible. Such defects include an electric defect such as an open circuit or a short circuit in various transistors, and a conduction fault of an opening pattern.

In the conventional electron beam inspection, the electron beam is irradiated during an inspection. Then, the secondary electrons or the reflected electrons generated by the irradiation are detected and converted into a signal, for the inspection. Irradiation of the electron beam is thus continued during the inspection. For this reason, when the surface of the wafer to be inspected is made of an insulating material and is easily subject to the influence of charge, or when a structure floated from the substrate is formed on the wafer to be inspected and charged electrons tend to be accumulated on the floated structure, the charged electrons resulting from the charge are accumulated on the insulating material during the process of the inspection. The charged potential of the surface of the wafer will therefore be changed from an initial state. When the charged potential is changed, the focusing position or irradiating position of the electron beam will be changed. Thus, a magnification for an electron beam image obtained during the inspection does not become accurate. Further, a positional drift or a focusing deviation is generated, so that the quality of the electron beam image obtained during the inspection will be changed. Hence, it has become difficult to continue the inspection with the same sensitivity and accuracy as those in the initial stage of the inspection.

Assume that an electron beam irradiating condition is changed in conjunction with the charged potential of the surface of the wafer to be inspected, when the charged potential changes. Then, the same electron beam image quality can be obtained. For this purpose, it is necessary to measure the charged potential of the wafer to be inspected real time during the inspection. It is therefore difficult to measure the charged potential real time based on the electron beam image alone. Further, it is possible to obtain the electron beam image of the same quality by correcting the focus and irradiating position of the electron beam irradiation whenever the quality of the electron beam image is changed during the inspection. However, when frequent suspension of the inspection and frequent focusing and positional alignment are performed on the wafer to be inspected, the time required for the inspection will become longer. Hence, speeding up of the inspection has become difficult, which leads to an increase in the manufacturing cost of the semiconductor device.

Further, by setting an inspecting condition that causes a less change in the charged potential when the inspecting condition is set, the inspection of the semiconductor device using a stable image becomes possible. However, to do so, a method of performing the inspection for a long time using the set condition, checking presence or absence of a drift in the image, and obtaining an optimal inspecting condition was employed. An enormous time was therefore required for determining the optimal inspecting condition.

In the conventional electron beam inspection, the electron beam is irradiated onto the wafer to be inspected during the inspection. Then, the secondary electrons or the reflected electrons generated by the electron beam irradiation are detected and converted into a signal, for the inspection. Irradiation of the electron beam is thus continued during the inspection. For this reason, when the surface of the wafer to be inspected is made of an insulating material and is easily subject to the influence of charge, or when a structure floated from the surface is formed on the wafer to be inspected and charged electrons tend to be accumulated on the floated structure, the charged electrons are accumulated on the insulating material during the process of the inspection. The quality of the electron beam image is not therefore stabilized. The conventional arts described above did not refer to a method of addressing this problem, or the method of obtaining the image without changing the charged state of the wafer during the inspection.

SUMMARY OF THE INVENTION

An object of the present invention is therefore to provide a technology for inspecting patterns of a semiconductor device or the like, which can reduce the influence of charge on a wafer to be inspected during an inspection. This technology can be applied to the wafer to be inspected having a structure floated from the substrate thereof which is easily subject to the influence of the charge and charged electrons tend to be accumulated thereon.

An apparatus for inspecting patterns according to the present invention including means for irradiating an electron beam onto the surface of a specimen with one of the patterns formed thereon, detection means for detecting a signal generated from the specimen, and means for imaging the signal detected by the detection means, the apparatus further including:

means for changing the potential of the specimen or the potential of an electrode provided on a side, with respect to the specimen, where the electron beam is irradiated;

means for changing the potential of the specimen or the potential of the electrode, thereby obtaining an electron beam image at each potential; and means for performing numeric conversion on information indicating contrast of the electron beam image or brightness of the electron beam image, for display.

It is arranged that the potential of the specimen or the potential of the electrode can be arbitrarily set within a predetermined range. Then, there is provided means for setting the potential within the range where the charged potential of the surface of the specimen to be inspected is changed from positive to negative, obtaining the electron beam at each of plurality of potentials, and performing numeric conversion on image information, for display.

A method for inspecting patterns according to the present invention includes the steps of:

irradiating an electron beam onto a surface of a specimen with one of the patterns formed thereon and scanning the specimen;

detecting a signal secondarily generated from the specimen by the electron beam;

imaging the detected signal, for display;

changing the potential of the specimen or the potential of an electrode provided on a side, with respect to the specimen to be inspected, where the electron beam is irradiated, thereby obtaining an electron beam image at each potential; and performing numeric conversion on information indicating contrast of the obtained electron beam or brightness of the obtained electron beam image, for display.

Further, from electron beam image information obtained when the potential of the electrode above the specimen is changed, a point of change with brightness of the electron beam image starting to decrease is selected as an inspecting condition, for display, or set as the inspecting condition. Further, the potential of the specimen or the potential of the electrode is extensively and coarsely changed in several stages, thereby obtaining the electron beam image in each of the stages. The point of change with the brightness of the obtained electron beam image starting to decrease is obtained from information on the obtained electron beam image. Then, the potential is changed in finer stages in the vicinity of the point of change, thereby obtaining the electron beam image in each of the finer stages again. Then, the point of change is obtained again from information on the electron beam image obtained again. An optimal inspecting condition can be thereby set with high efficiency and with high accuracy.

Assume the specimen (or substrate) such as the semiconductor device, having a fine circuit pattern formed thereon, or the wafer to be inspected in particular, of which the surface of the substrate is covered with an insulating film or which has the circuit pattern floated from the substrate. Then, using the technology described above, the potential of the substrate or the potential of the electrode for limiting charge, provided on the side of an electron beam source for irradiating the electron beam with respect to the substrate is determined so that a so-called state of equilibrium is maintained. In the state of equilibrium, the number of electrons pulled back from the substrate maintains equilibrium with the number of electrons returned to the substrate. Then, by setting this potential as the inspecting condition, the influence of charge on the specimen can be reduced.

According to the present invention, even for the wafer to be inspected that is easily subject to the influence of charge, it becomes possible to set the optimal inspecting condition for implementing stable inspection easily and with high accuracy. As a result, it becomes possible to perform highly sensitive inspection of a defect on the wiring test pattern which has been hitherto difficult to identify the location of the defect therein.

Further, when setting the optimal inspecting condition, conventionally, the defect detection sensitivity of the inspection and a set time for the inspection were varied according to the skill and the experience of an operator. On contrast therewith, according to the present invention, the optimal inspecting condition can be set in a short time. Accordingly, the time required for the operator to perform the inspection can be saved. A waiting period for products is also greatly reduced, so that a TAT (turnaround time) for detecting occurrence of a fault can be reduced. As described above, by providing the technology for inspecting the wiring step of the semiconductor device with high sensitivity and with high accuracy, the contents of a fault in the wiring step, which are important during the manufacturing process of the semiconductor device can be detected early. Further, information on the location and the size of the defect which is the cause of the fault necessary for taking countermeasures against the fault can be obtained substantially at the same time as the inspection. The TAT required until the countermeasures are taken can be thereby reduced, thus resulting in contribution to improvement in the yield and productivity of the semiconductor device.

Other objects, features and advantages of the invention will become apparent from the following description of the embodiments of the invention taken in conjunction with the accompanying drawings.

BRIEF DESCRIPTION OF THE DRAWINGS

FIG. 7 is a diagram showing a result of inspection of presence or absence of a fault using a wiring test pattern;

DESCRIPTION OF THE EMBODIMENT

A technology of inspecting patterns according to an embodiment of the present invention will be described in detail with reference to drawings by taking inspection of a circuit pattern on a semiconductor device as an example.

First, before the embodiment of the present invention is described, the principle underlying the technology of inspecting the semiconductor device according to the present invention will be described in detail. The technology of inspecting presence or absence of a defect in a pattern such as the circuit pattern of the circuit having a structure floated from a substrate using an electron beam will be described, taking the circuit pattern of the semiconductor device formed on a wafer as an example.

Figure 1:
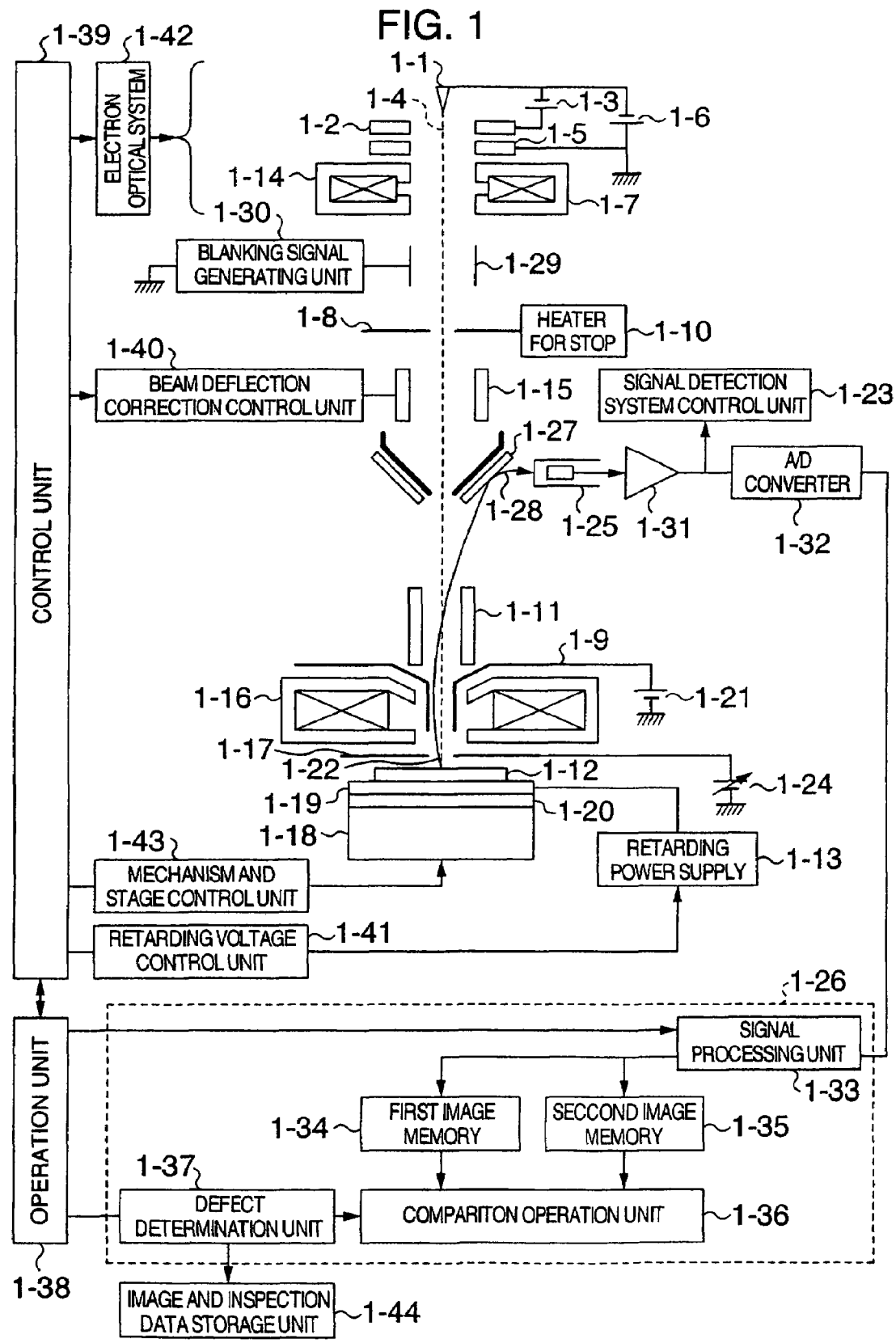
FIG. 1 is a diagram showing an example of a configuration of an inspection apparatus for a semiconductor device according to an embodiment of the present invention.

FIG. 1 is a diagram showing an example of a configuration of an apparatus for inspecting the circuit pattern according to an embodiment of the present invention. The apparatus for inspecting the circuit pattern in this embodiment is roughly constituted from an electron optical system, a stage mechanism system for mounting the wafer thereon or moving the wafer therefrom, a wafer carrying system for loading the wafer there onto, a vacuum exhaust system for making the apparatus within a chamber to be in a high vacuum state, a control system for controlling respective units of the apparatus, an image processing system for performing processing on an observed image, and an operating system to be operated by a user. Details of the configuration in FIG. 1 will be described later.

An example of a structure of the wafer to be inspected will be described with reference to FIGS. 2 to 6. In this embodiment, the wafer with a metal wiring test pattern formed on a Si substrate thereof is employed as the wafer to be inspected.

Figure 2:
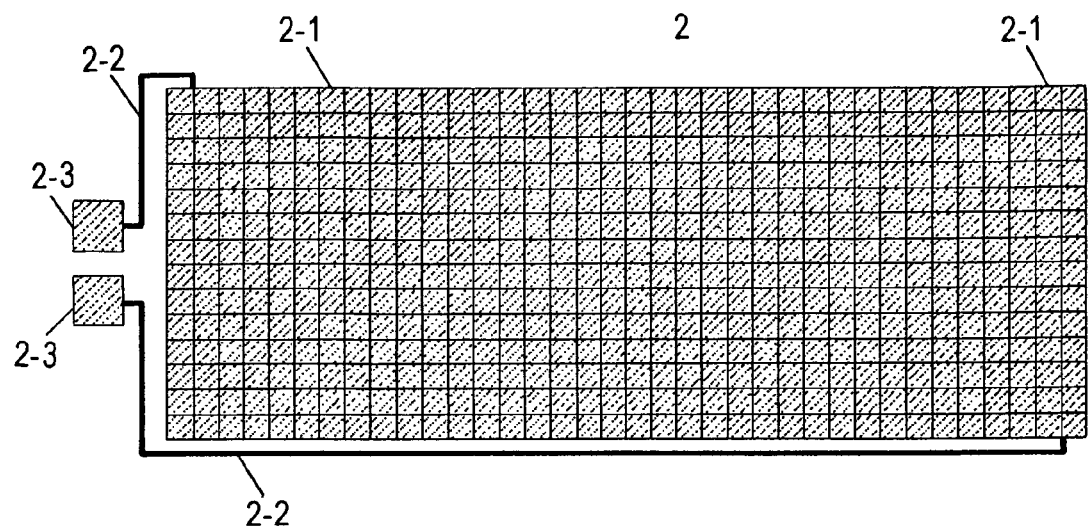
FIG. 2 is a diagram showing an example of a wiring test pattern.

FIG. 2 is a diagram showing an example of an overall configuration of the metal wiring test pattern. As shown in FIG. 2, a test pattern 2 is constituted as a group of a lot of blocks 2-1. From both sides of the test pattern 2, wirings 2-2 are extended, and one ends of the wirings 2-2 are connected to signal measuring pads 2-3.

Figure 3:
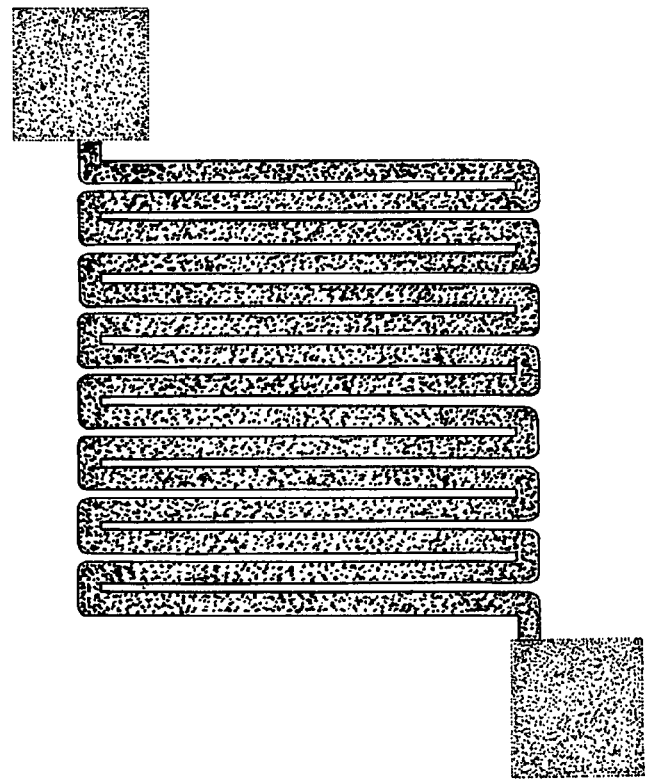
FIG. 3 is a diagram showing an example of a wiring test pattern for inspecting a wire break.
Figure 4:
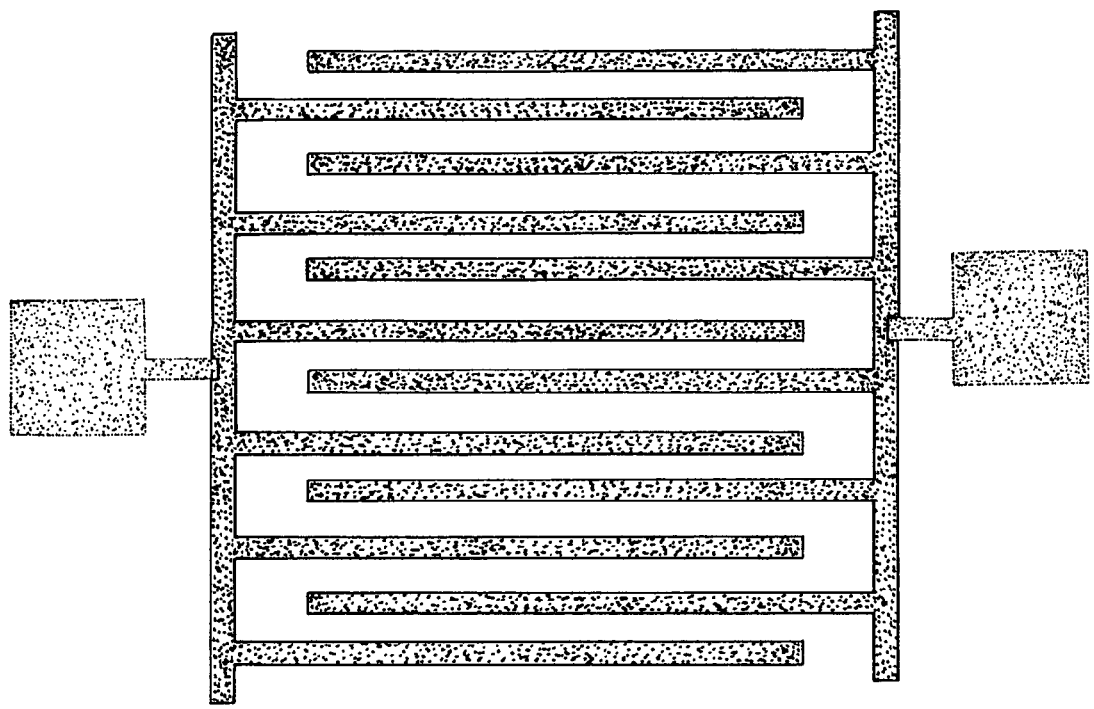
FIG. 4 is a diagram showing an example of a wiring test pattern for inspecting a short circuit.

FIG. 3 is a diagram showing an example of a typical wiring configuration. As shown in FIG. 3, the pattern may be constituted from one long wiring. Alternatively, the pattern may be constituted from alternating comb-tooth patterns as shown in FIG. 4, or the pattern may be constituted from a contact chain obtained by connecting isolated wirings on two layers using via holes between the layers. All of these wiring test patterns are isolated from the Si substrate by an insulating film, thus each forming a so-called floating structure.

Figure 5:
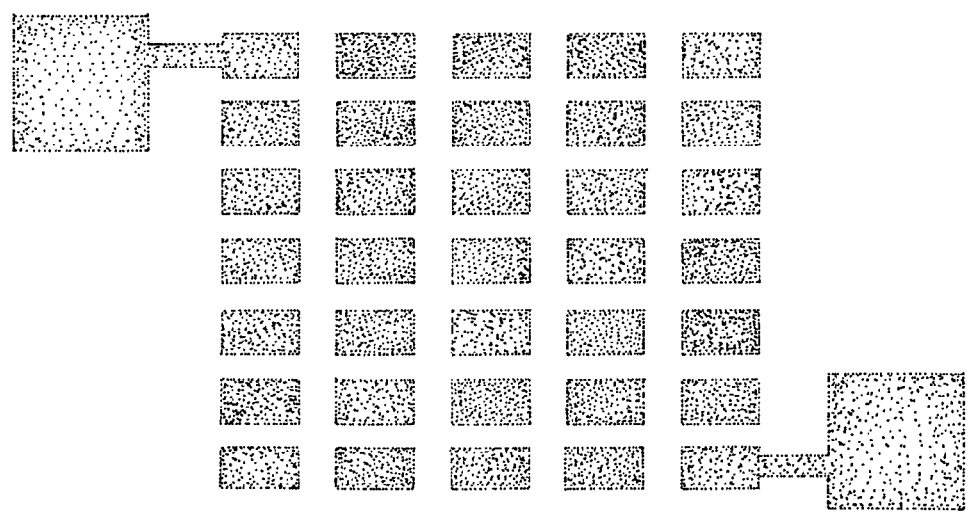
FIG. 5 is a diagram showing an example of a wiring test pattern for inspecting a conduction fault.
Figure 6:
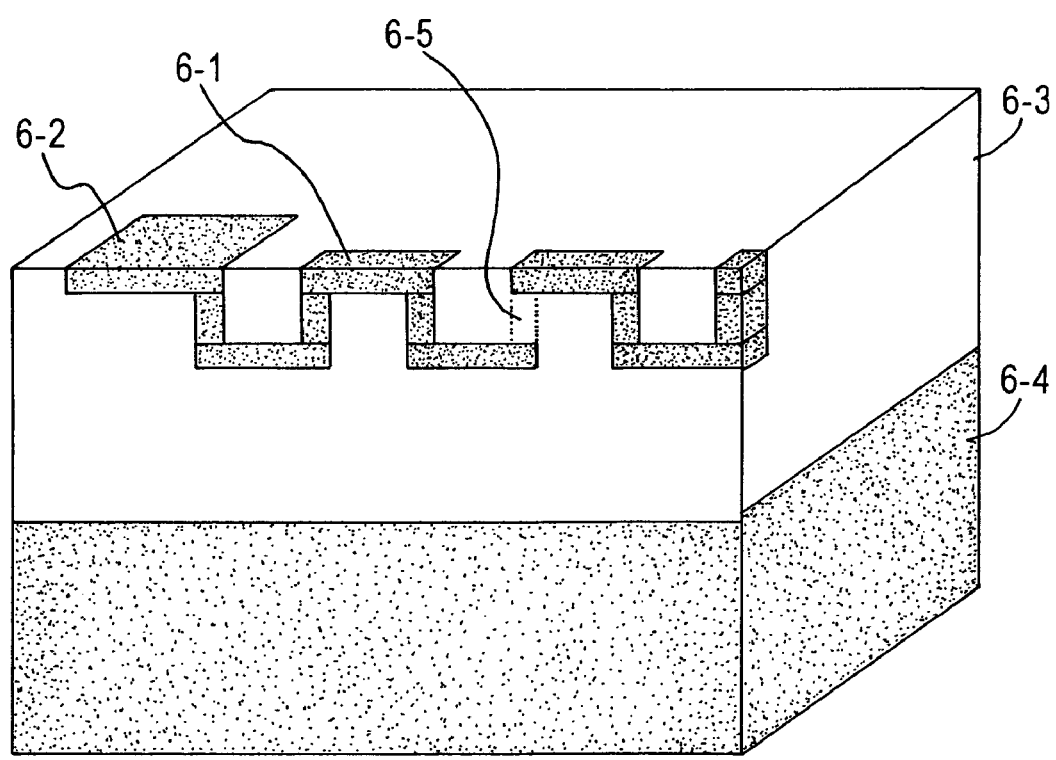
FIG. 6 is a perspective view showing a structure of the wiring test pattern for inspecting the conduction fault.

FIG. 6 is a perspective view of the contact chain shown in FIG. 5. As shown in FIG. 6, an inter-layer insulating film 6-3 is formed on a Si substrate 6-4. On the inter-layer insulating film 6-3, a contact chain pattern 6-1 is formed. Though one of signal measuring pads 6-2 is shown in FIG. 6 for convenience of description, the signal measuring pads 6-2 are arranged on both sides of the pattern 6-1.

Assume that a non-conducting defect 6-5 is present in a via hole for conduction in such a pattern, for example. Then, when a probe is applied to both ends of the signal measuring pad 6-2 to measure electrical characteristics, the value of resistance differs from a case where there is no defect. By checking this resistance value, presence or absence of a fault can be inspected. For the patterns in FIGS. 3 and 4, same resistance value measurement is carried out. When a wire break occurs in the wiring of the pattern in FIG. 3, the resistance value of the pattern becomes higher than that of a normal pattern. In the pattern in FIG. 4, the two comb-tooth patterns are insulated. Accordingly, when a short circuit occurs in this pattern, the resistance value becomes low.

Figure 7:
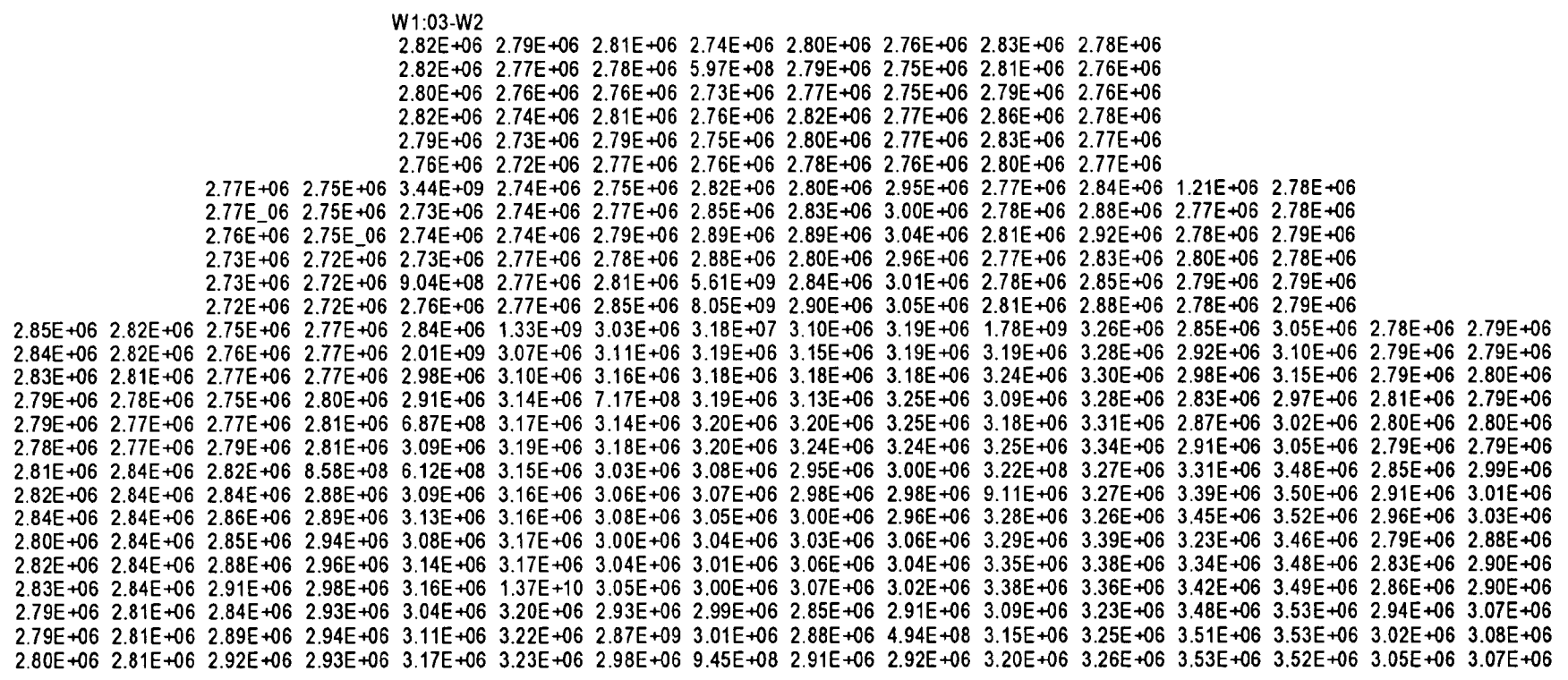

FIG. 7 is a diagram showing an example in which the measurement has been carried out. This embodiment shows the example in which the measurement of the contact chain has been carried out. The normal contact chain pattern shows the resistance value of an order of $10^6 \Omega$, and the resistance values of $10^7 \Omega$ or more are shown as faults. By measuring the resistance as described above, presence or absence of a defect can be detected. In FIG. 7, locations colored in gray shows the locations of defective pattern portions. It cannot be known, however, where the defect has occurred in the test pattern. For this reason, it is difficult to trace down the contents of the defect and the cause of the defect. Thus, it would take much time to devise countermeasures against the defect. An inspection method of identifying the location of the defect is therefore required.

Figure 8:
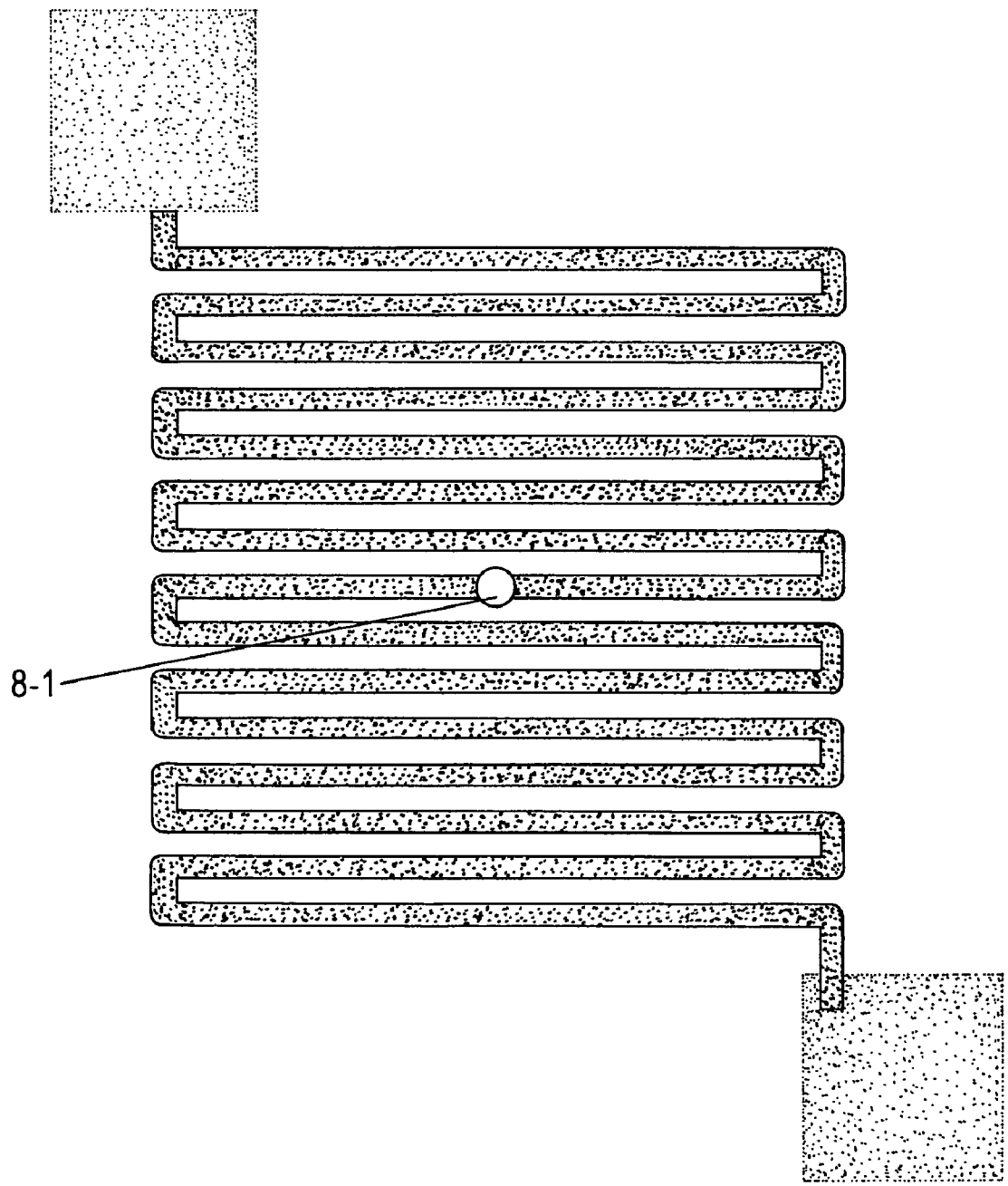
FIG. 8 is a diagram showing contrast of the pattern when the wire break has occurred.
Figure 9:
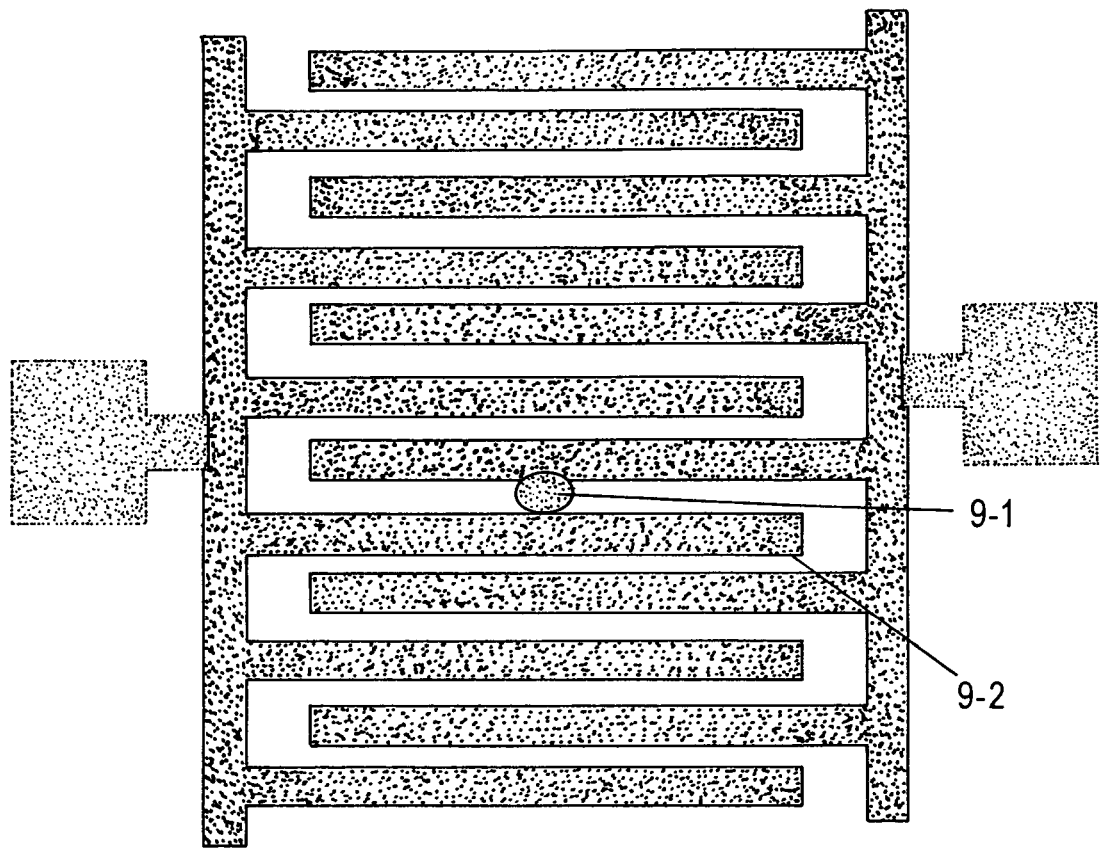
FIG. 9 is a diagram showing contrast of the pattern when the short circuit has occurred.
Figure 10:
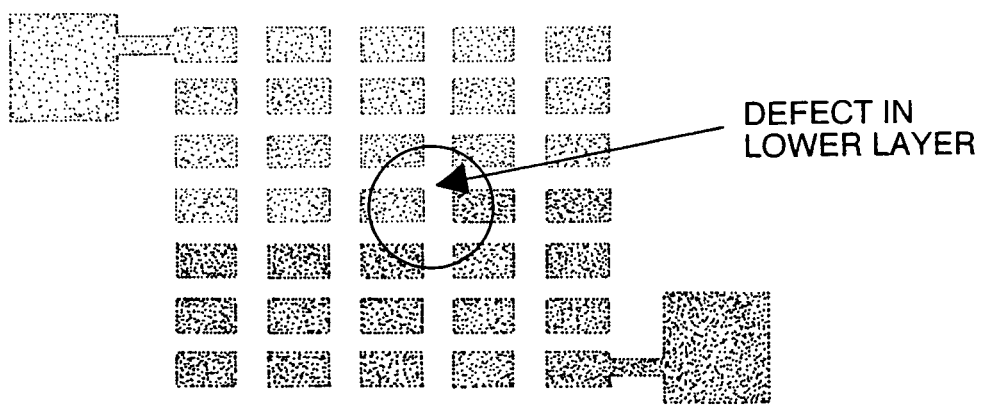
FIG. 10 is a diagram showing contrast of the pattern when the conduction fault has occurred.

A technology capable of identifying a faulty location as well will be described below. By performing inspection using the inspection apparatus shown in FIG. 1, the location of a defect can be identified by using potential contrast. FIGS. 8 to 10 show electron beam images obtained by measurement using the inspection apparatus in FIG. 1 and shows the electron beam images when defects have occurred. In the case of the test pattern in FIG. 3, when an electron beam is irradiated along wiring, the charged potential of the test pattern changes at both ends of the wiring with a wiring break portion 8-1 acting as a boundary between the both ends. The electron beam image obtained by observing this change becomes the one as shown in FIG. 8 as a potential contrast image. The location of the defect 8-1 can be estimated based on this potential contrast image.

In the case of the pattern shown in FIG. 4, even if the wirings of the pattern are short-circuited, the electric potential change does not occur. Accordingly, brightness of a defect in this pattern does not change in the form of the potential contrast. However, a short-circuit failure occurs between the wirings. Thus, using a change in the contrast between the wirings, or a contrast between a defective portion 9-1 and a wiring 9-2 as shown in FIG. 9, the location of the defective portion can be estimated.

Figure 11:
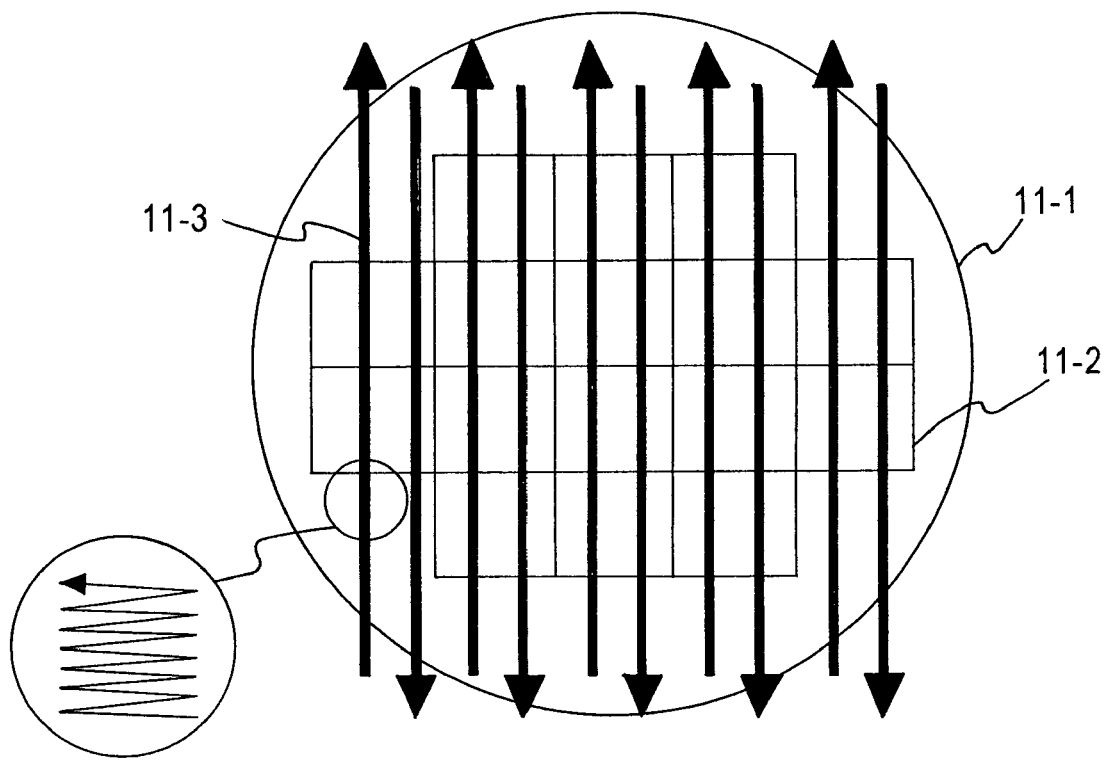
FIG. 11 is a diagram showing an electron beam scanning method during inspection.

In the case of the pattern shown in FIG. 5, by irradiating the electron beam in a direction in which the contact chain is connected, a defect portion 10-1 manifests itself as the potential contrast and becomes a circle shown in FIG. 10, as in the case of the pattern in FIG. 3. As described above, by using the electron beam image, the defective portion can be made to manifest itself. When the entire surface of the wafer is inspected, the electron beam is continuously irradiated as shown in arrows and a zig-zag arrow shown in a large circuit in FIG. 11. Accordingly, electric charges are accumulated on the surface of the wafer, so that the charged state of the surface of the wafer sometimes changes from the charged state of the surface of the wafer when inspection has been started, as shown in FIG. 12.

Figure 12:
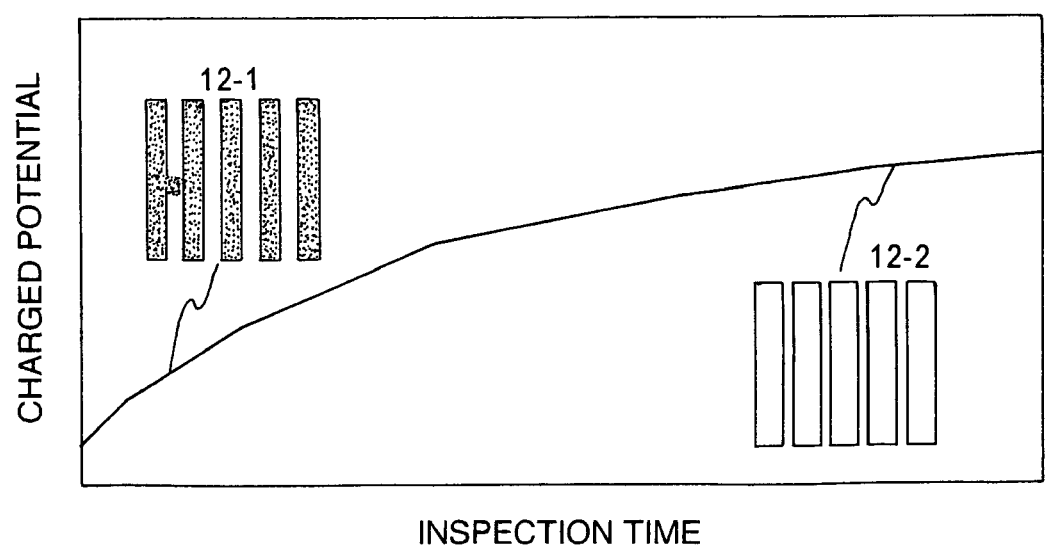
FIG. 12 is a graph showing a change in charge and a change in an image caused by the change in the charge during the inspection.

FIG. 12 is a graph schematically showing a change of the charged potential of the surface of the wafer over time. The horizontal axis of the graph represents time, while the vertical axis of the graph represents the charged potential of the surface of the wafer. Since the focusing condition of electron beam irradiation differs between an initial image 12-1 and an image 12-2 showing a state in which the electric charges are accumulated, a manner in which a defect is seen is also changed. Thus, it can be seen that detection sensitivity of the defect is reduced. The inventor of the present invention conceived that, by performing the inspection with an irradiating condition that does not cause a change in the charged state of the wafer surface, the problem associated with the change in the charged potential over time could be solved.

Referring again to FIG. 1, the inspection apparatus for the semiconductor device in this embodiment will be described in detail. As shown in FIG. 1, the electron optical system includes an electron gun 1-1, draw-out electrodes 1-2 and 1-5, a condenser lens 1-14, a blanking deflector 1-29, a stop 1-8, deflectors 1-15 and 1-11, an objective lens 1-16, a charge control electrode 1-17, an ExB deflector 1-9, reflection boards 1-27, a detector 1-25, and a power supply for charge control electrode 1-24 capable of applying an adjustable voltage to the charge control electrode 1-17. Voltages are supplied from power supplies for draw out electrode 1-3 and 1-6 to the draw-out electrodes 1-2 and 1-5. In order to prevent contamination of the stop 1-8 and a longer operating life of the stop 1-8, a heater for stop 1-10 is provided. A signal is sent to the blanking deflector 1-29 from a blanking signal generating unit 1-30, so that an electron beam 1-4 is deflected to prevent passage through the aperture portion of the stop 1-8. Irradiation of the electron beam 1-4 onto a wafer 1-12 is thereby prevented.

The stage mechanism system includes an XY stage 1-18, an insulating layer 1-20, a holder 1-19 for mounting the wafer 1-12 thereon, and a retarding power supply 1-13 capable of applying a zero or negative voltage to the wafer 1-12 or substrate. A position detector using laser measurement is mounted on the XY stage 1-18.

The control system includes a signal detection system control unit 1-23, a beam deflection correction control unit 1-40, an electron optical system control unit 1-42, and a mechanism and stage control unit 1-43. Irradiation of the electron beam 1-4 onto the wafer 1-12 causes a signal generated from the wafer to strike one of the reflection boards 1-27, thereby generating a secondary signal 1-28. This signal is detected by the detector 1-25 and amplified by a detection signal amplifier 1-31. The amplified analog signal is converted to a digital signal by an A/D converter 1-32 and transmitted to a signal processing unit 1-33 in an image processing system 1-26. The signal detection system control unit 1-23 can generate a clock frequency, and thereby can change a timing in which the secondary signal is generated. The beam deflection correction control unit 1-40 controls voltages to be applied to the deflectors 1-15 and 1-11, thereby controlling a deflection amount, deflection speed, and deflection direction of the electron beam 1-4. The electron optical system control unit 1-42 controls the draw-out electrodes 1-2 and 1-5, condenser lens 1-14, and blanking signal generating unit 1-30. The electron optical system control unit 1-42 adjusts the current value of the condenser lens 1-14 in particular, thereby controlling the current of the electron beam 1-4. The image processing system 1-26 includes a signal processing unit 1-33, a first image memory 1-34, a second image memory 1-35, a comparison operation unit 1-36, a defect determination unit 1-37, and a retarding voltage control unit 1-41. The operating system includes an operation screen, an operating unit 1-38, and an image and inspection data storage unit 1-44.

By changing a voltage to be applied to the charge control electrode 1-17 provided above the wafer 1-12 (on the side of the electron gun 1-1) by the power supply for charge control electrode 1-21, the amount of secondary electrons which are generated by irradiation of the electron beam onto the wafer 1-12 and will reach the detector 1-25 can be adjusted.

The reference numeral 1-3 designates a power supply for draw-out electrode. The reference numeral 1-4 designates an electron beam. The reference numeral 1-5 designates a drawout electrode. The reference numeral 1-7 designates a condenser lens. The reference numeral 1-8 designates a stop. The reference numeral 1-10 designates a heater for stop. The reference numeral 1-24 designates a power supply for charge control electrode. The reference numeral 1-28 designates a secondary signal. The reference numeral 1-29 designates a blanking deflector. The reference numeral 1-30 designates a blanking signal generating unit. The reference numeral 1-31 designates a detection signal amplifier. The reference numeral 1-32 designates an A/D converter. The reference numeral 1-39 designates a control unit. The reference numeral 1-41 designates a retarding voltage control unit.

Next, a flow of processing for setting the irradiating condition that does not cause a change in the charged state of the wafer surface will be described with reference to FIGS. 13 to 15. A description will be made with reference to FIG. 1, if necessary.

First, at step 13-1, the processing is started, and the wafer 1-12 to be inspected is loaded. Next, a layout of the circuit pattern of the wafer 1-12 to be inspected is set, at step 13-2. This step of setting the layout is performed when the wafer is a new product. When product data on the same layout has already been set, automatic retrieval of the layout data can be performed if the set product data is selected. Next, an image of the wafer 1-12 to be inspected is obtained, and alignment is performed at step 13-3. With this arrangement, information on rotation of the wafer 1-12 to be inspected and information on the position of the wafer 1-12 are thereby obtained and fed back to deflection control during electron beam scanning. Beam irradiation is thereby accurately performed onto a region to be inspected, and a magnification at the time of comparison with the image of an adjacent region is thereby corrected. Next, the irradiating condition of the electron beam is set at step 13-4.

Assume that an inspection object is a floating wiring pattern. Then, when the beam irradiating condition is set so that the amount of emitted electrons becomes substantially the same as the amount of secondary electrons that will be generated, charging will not vary even if irradiation of the electron beam is continued. For this reason, a voltage to be applied from the power supply for charge control electrode 1-21 to the charge control electrode 1-17 above the wafer is swung, thereby adjusting the amount of the generated secondary electrons that will reach the detector 1-25. When a barrier potential formed by the voltage applied to the charge control electrode 1-17 is higher than the potential of the wafer 1-12 to be inspected, the secondary electrons are actively lifted toward upward. The floating wiring pattern of the wafer 1-12 to be inspected is therefore positively charged. When the voltage to be applied to the charge control electrode 1-17 is reduced so that the barrier potential becomes the same as or lower than the potential of the wafer 1-12, part of the secondary electrons are pulled back to the surface of the wafer 1-12. Then, when the voltage to be applied to the charge control electrode 1-17 is further reduced, the ratio of the secondary electrons pulled back to the surface of the wafer 1-12 is increased. The surface of the wafer 1-12 is thereby negatively charged due to the pulled back electrons. Since a lot of the generated secondary electrons are pulled back to the surface of the wafer 1-12 in this case, the number of the electrons that will reach the detector 1-25 is reduced, so that the image will be darkened. Since the relationship between the voltage to be applied to the charge control electrode and brightness of the image as described above is present, the potential state of the surface of the wafer 1-12 can be known by measuring the number of the secondary electrons that has reached the detector 1-25 or the brightness of the image.

Figure 14:
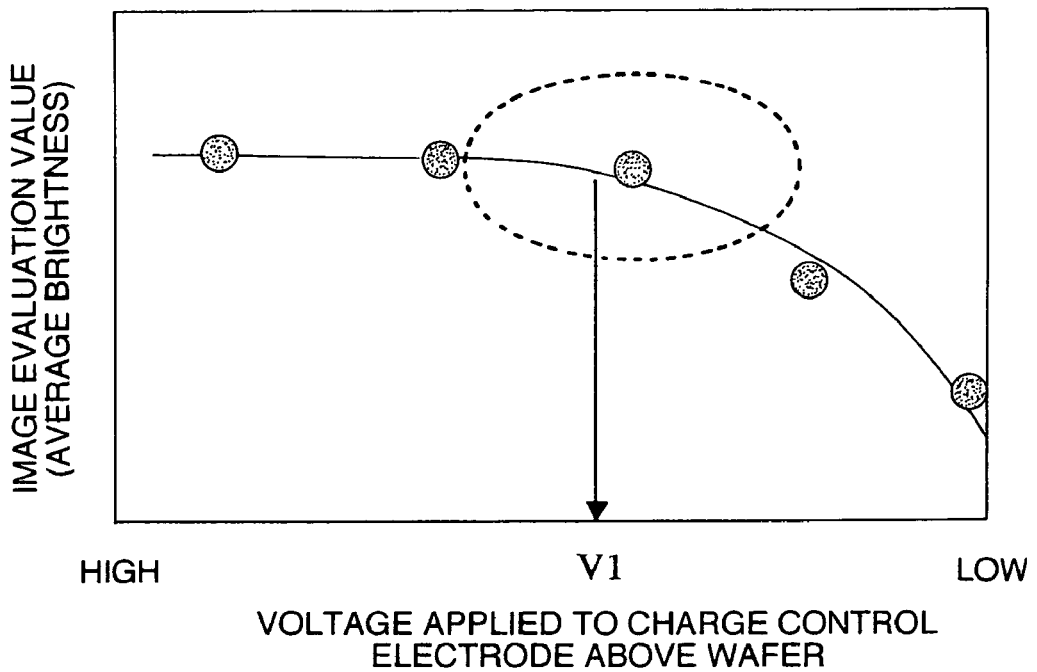
FIG. 14 is a graph showing corresponding electron beam image signals when an electrode potential has been changed.

FIG. 14 is a graph showing the relationship between the electrode potential of the charge control electrode 1-17 and the brightness of the electron beam image. It can be seen that, as the electrode potential of the charge control electrode 1-17 above the surface of the wafer 1-12 is reduced, the brightness of the image is reduced, as described above. A region with the constant brightness of the image shows the state of positive charging, while a region that is darkened shows the state of negative charging. Accordingly, a point of change in the brightness may be a boundary between the state of the positive charging and the state of the negative charging or the point at which switching between the positive charging and the negative charging is performed and the point which is weakly charged. By setting this point of change as an inspecting condition, the amount of electric charges on the surface of the wafer can be reduced, and stable inspection on the wafer can be performed. In an example shown in FIG. 14, a region in the vicinity of an applied voltage V1 is estimated to be the point of change. The point of change is roughly included in the voltage range of a region enclosed by a broken line in the vicinity of the applied voltage V1.

Figure 15:
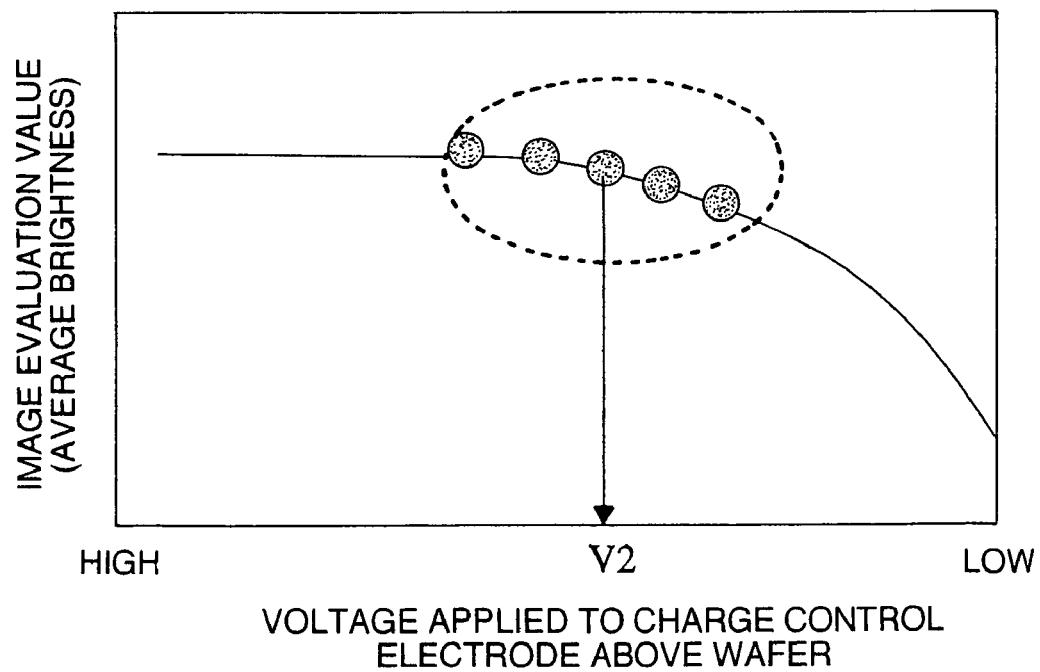
FIG. 15 is a diagram showing corresponding electron beam image signals when the electrode potential has been changed.

In order to obtain the point of change with a higher accuracy, by finely changing the electrode potential of the charge control electrode 1-17, the electron beam images of the region in the vicinity of the applied voltage V1 enclosed by the broken line are obtained as shown in FIG. 15. Then, correspondences with signals showing the brightness of the image are detected. An optimal irradiating condition can be thereby obtained in a short time, with a high efficiency, and with high accuracy. Assume that an image evaluation value of a positively charged region (or a high voltage region) is set to 100%. The image evaluation value indicates the average brightness of the image and the image evaluation value of 100% is obtained when the image evaluation value is flat. Then, processing for setting the value of the applied voltage that makes the image estimation value to be 90% to an applied voltage V2, for example, is performed.

Figure 13:
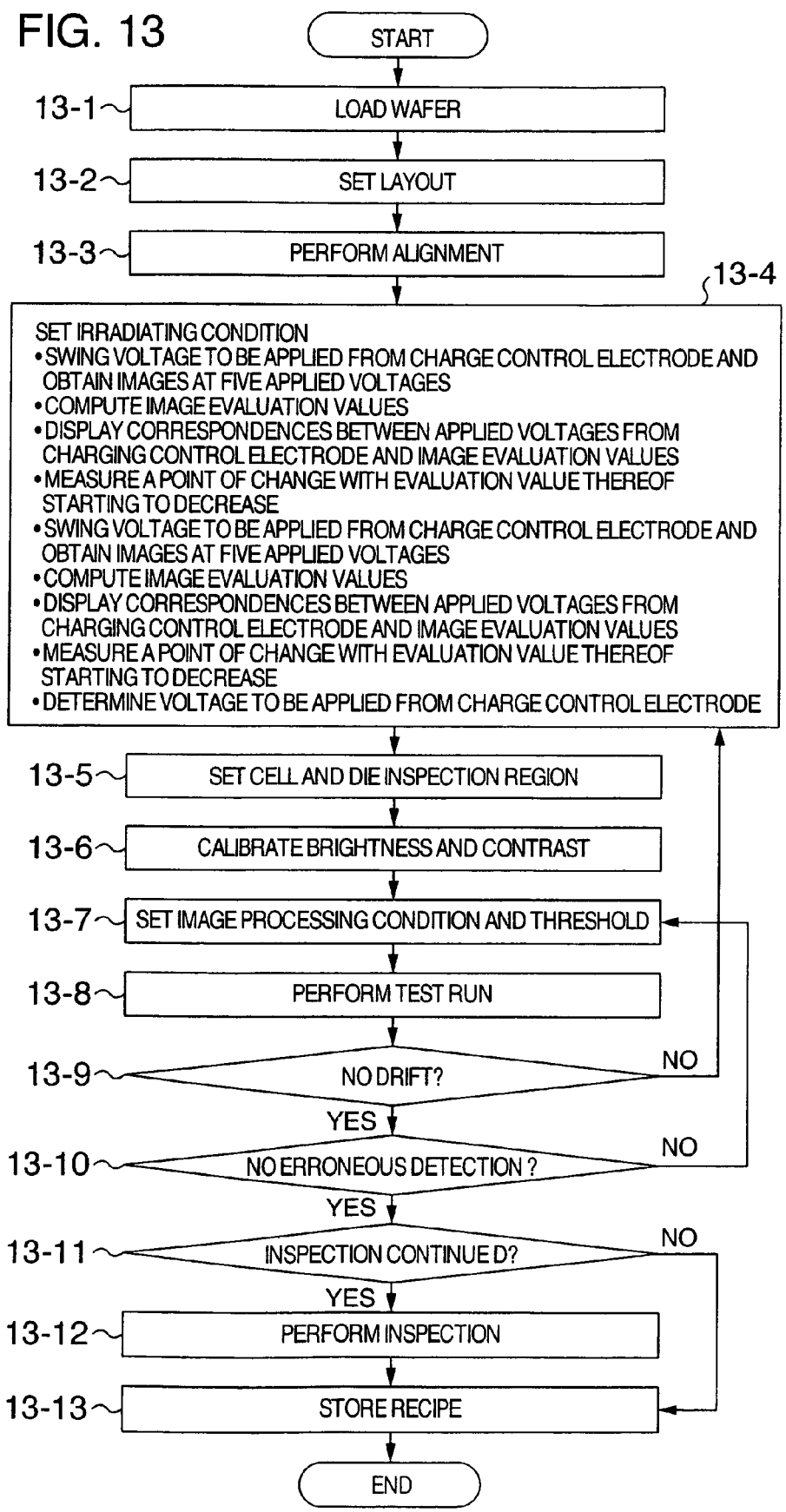
FIG. 13 is a diagram showing a flow for setting an inspecting condition.

As a procedure of setting the irradiating condition, following processing as shown at step 13-4 in FIG. 13 is performed.
1) The voltage to be applied to the charge control electrode is swung to obtain images at five applied voltages, for example.
2) The image evaluation values of the images are computed.
3) Correspondences between the voltages applied to the charge control electrode and the image evaluation values are displayed.
4) The applied voltage at which the evaluation value starts to decrease is measured.
5) The voltage applied to the charge control electrode in the vicinity of this applied voltage is finely swung to obtain five images at five applied voltages, for example.
6) The image evaluation values of the images are computed.
7) Correspondences between the voltages applied to the charge control electrode and the image evaluation values are displayed.
8) The applied voltage at which the image evaluation value starts to decrease is measured.
9) The voltage V2 to be applied to the charge control electrode is determined.

After the irradiating condition that should be set has been determined as described above, a cell and die inspection region (or a wafer inspection region) is set at step 13-5, and the brightness and the contrast of the image in the wafer inspection region are set to be optimal at step 13-6. Then, an image processing condition and a threshold value are set at step 13-7. A test run of the inspection is thereby performed at step 13-8. At the time of the trial inspection, the location being inspected and presence or absence of drift of a focal point are checked at step 13-9. If the drift is not generated at step 13-9 (YES at step 13-9), presence or absence of erroneous detection is checked at step 13-10. Then, if required, the inspection is continuously executed at step 13-11. A recipe, which is the set condition obtained from the processing is stored in a memory or the image and inspection data storage unit 1-44 at step 13-13. Then, steps of the inspection are finished. If the drift is generated, the procedure is returned to the step 13-4 for setting the irradiating condition, and checking of the irradiating condition is performed again. Then, a newly obtained optimal irradiating condition is set. Further, when the erroneous detection is generated at step 13-10, the procedure is returned to the step 13-7 for setting the image processing condition and the threshold. Parameters are thereby changed.

Figure 16:
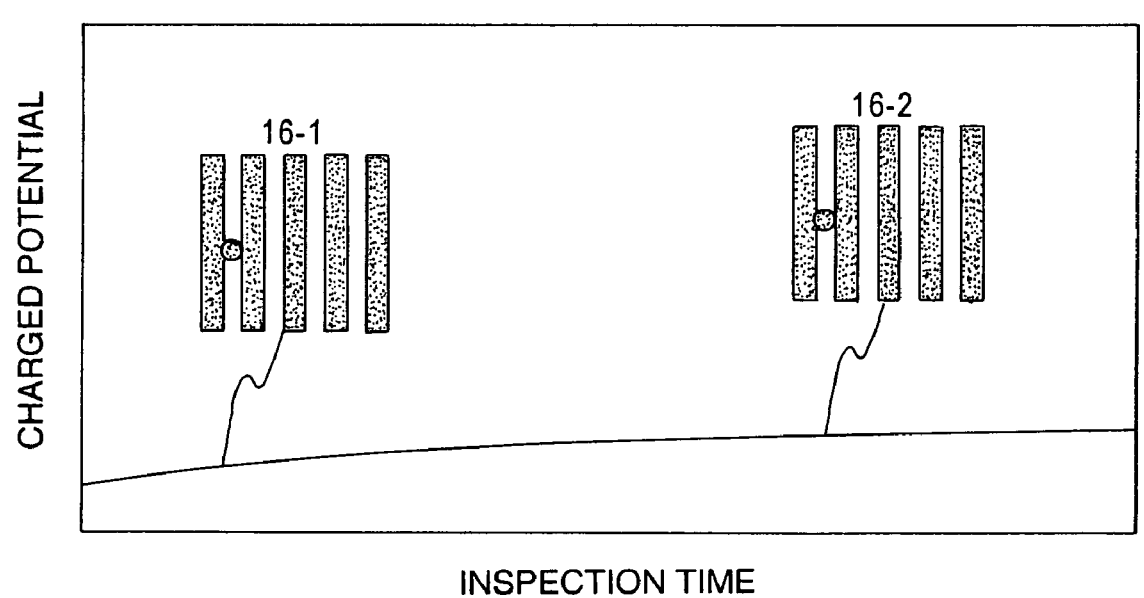
FIG. 16 is a graph showing a change in charge and a change in the image caused by the change in the charge during the inspection after an optimal inspecting condition has been set.

Conventionally, there was no method of determining the optimal irradiating condition. Hence, by performing checking after the test run, the irradiating condition was determined. Accordingly, whenever the drift was generated, adjustment is repeated. An enormous time was therefore required for setting the recipe. When the irradiating condition is set and the inspection is performed using the inspection technology according to this embodiment, a change between an image 16-1 in an initial state of the inspection and an image 16-2 in an advanced state of the inspection can be reduced, as shown in FIG. 16. The inspection can be thereby continued with the same sensitivity.

By using the inspection technology described so far, it becomes possible to determine and set an optimal inspecting condition easily and with high accuracy. Under the optimal inspection, the stable inspection can be performed even on the wafer to be inspected that is easily subject to the influence of charge, without interruption. As a result, it becomes possible to perform inspection of a defect on the wiring test pattern including the floating structure which has been hitherto difficult to identify the location of a defect therein, with high sensitivity. Further, when setting the optimal inspecting condition, conventionally, the defect detection sensitivity of the inspection and a set time for the inspection were varied according to the skill and the experience of an operator. On contrast therewith, by using the technology according to this embodiment, the optimal inspecting condition can be set in a short time. Accordingly, the time required for the operator to perform the inspection can be saved. A waiting period until switchover to the next manufacturing step is performed is greatly reduced, so that a turnaround time (TAT) for detecting occurrence of a fault can be reduced.

As described above, according to the inspection technology in this embodiment, the wiring step of the semiconductor device can be inspected with high sensitivity and with high accuracy. Thus, the contents of a fault in the wiring step, which are important during the manufacturing process of the semiconductor device can be detected early. Further, information on the location and the size of the defect which is the cause of the fault necessary for taking countermeasures against the fault can be obtained substantially at the same time as the inspection. The TAT required until the countermeasures are taken can be thereby reduced, thus resulting in contribution to improvement in the yield and productivity of the semiconductor device.

The foregoing description was directed to a specific flow of the inspection, operations of respective units of the inspection apparatus, a flow for determining the condition of the inspection, and the embodiment of the manner of operation for the inspection and for setting the condition of the inspection. The method of the inspection and the inspection apparatus with a plurality of characteristics claimed within the scope of the present invention combined therein can also be employed.

Incidentally, in the semiconductor device in this embodiment, an example was described in which the voltage is applied to the charge control electrode disposed above the wafer, thereby adjusting the amount of charges on the wafer. By changing the potential of the wafer and obtaining the electron beam image in the same manner as described above, a proper inspecting condition may be obtained.

As described above, according to the inspection technology for the semiconductor device in this embodiment, even when the wafer to be inspected is particularly and easily subject to the influence of charge, the optimal inspecting condition can be set easily and with high accuracy. Under the optimal inspecting condition, the stable inspection can be performed without interruption. As a result, highly sensitive inspection of a defect can be performed on the wiring test pattern which has been hitherto difficult to identify the location of a defect therein. Further, when setting the optimal inspecting condition, conventionally, the sensitivity of the inspection and the set time for the inspection were varied according to the skill and the experience of the operator. On contrast therewith, by using the technology according to this embodiment, the defect detection sensitivity of the inspection and the set time for the inspection can be set in a short time.

The present invention can be used as the inspection technology and the inspection apparatus for the semiconductor device.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An apparatus for inspecting patterns, comprising:
an electron source for generating an electron beam;
focusing means for focusing the electron beam and irradiating the electron beam onto a specimen with one of the patterns formed thereon;
a detector for detecting electrons generated from a surface of the specimen with the electron beam irradiated thereon;
imaging means for forming an electron beam image of said one of the patterns based on a signal detected by the detector;
determining means for determining a charge state of the specimen which allows the specimen to be inspected stably;
potential adjusting means for changing at least one of a potential of the specimen and a potential of an electrode provided on a side of the electron source with respect to the specimen, to maintain the determined charge state of the specimen; and
image evaluation value computation means for obtaining the electron beam image formed by the imaging means at each of a plurality of potentials adjusted by the potential adjusting means and determining an image evaluation value of the electron beam image.

2. The apparatus for inspecting patterns according to claim 1, further comprising: display means for displaying the image evaluation value and said each of the potentials corresponding to the image evaluation value.

3. The apparatus for inspecting patterns according to claim 1, wherein the image evaluation value indicates at least one of contrast of the electron image and brightness of the electron beam image.

4. An apparatus for inspecting patterns, comprising:
an electron source for generating an electron beam;
focusing means for focusing the electron beam and irradiating the electron beam onto a specimen with one of the patterns formed thereon;
a detector for detecting electrons generated from a surface of the specimen with the electron beam irradiated thereon;
imaging means for forming an electron beam image of said one of the patterns based on a signal detected by the detector;
determining means for determining a charge state of the specimen which allows the specimen to be inspected stably; and
potential adjusting means for changing at least one of a potential of the specimen or a potential of an electrode provided on a side of the electron source with respect to the specimen; to maintain the determined charge state of the specimen;
the electron beam image formed by the imaging means at each of a plurality of potentials adjusted by the potential adjusting means being obtained, and one of the potentials with brightness of the electron beam image corresponding to said one of the potentials starting to decrease being set as an inspecting condition potential for the potential adjusting means.

5. The apparatus for inspecting patterns according to claim 1, wherein when the potential of the specimen or the potential of the electrode above the specimen is changed by the potential adjusting means, a setting condition range is set so that the potential is changed from positive to negative.

6. A method for inspecting patterns using an inspection apparatus, the inspection apparatus comprising means for irradiating an electron beam onto a surface of a specimen with one of the patterns formed thereon and scanning the specimen, means for detecting a signal secondarily generated from the specimen by the electron beam, and means for imaging the detected signal, for display, the method comprising the steps of:
determining a charge state of the specimen which allows the specimen to be inspected stably,
changing a potential of the specimen or a potential of an electrode set above the specimen with respect to the specimen, to maintain the determined charge state of the specimen,
obtaining an electron beam image at each potential, and
performing numeric conversion on information indicating at least one of contrast of the obtained electron beam and brightness of the obtained electron beam image, for display.

7. A method for inspecting patterns using an inspection apparatus, the inspection apparatus comprising means for irradiating an electron beam onto a surface of a specimen with one of the patterns formed thereon and scanning the specimen, means for detecting a signal secondarily generated from the specimen by the electron beam, and means for imaging the detected signal, for display, the method comprising the steps of:
determining a charge state of the specimen which allows the specimen to be inspected stably,
changing a potential of the specimen or a potential of an electrode set above the specimen of the electron source with respect to the specimen, to maintain the determined charge state of the specimen,
obtaining an electron beam image at each potential, and
setting a point of change with brightness of the electron beam image starting to decrease when the potential of the specimen or the potential of the electrode is changed.

8. The method for inspecting patterns according to claim 7, wherein the step of changing the potential of the specimen or the potential of the electrode comprises the steps of:
extensively changing the potential in several stages, thereby obtaining the electron beam image in each of the stages;
obtaining the point of change with the brightness of the obtained electron beam image starting to decrease;
changing the potential in finer stages in the vicinity of the point of change, thereby obtaining the electron beam image in each of the finer stages again; and
obtaining a point of change again from information on the electron beam image obtained again.

9. The method for inspecting patterns according to claim 6, wherein when the potential of the specimen or the potential of the electrode is changed, the potential is changed so that a charged condition of the specimen is changed from positive to negative.

10. The apparatus for inspecting patterns according to claim 2, wherein the image evaluation value indicates at least one of contrast of the electron beam image and brightness of the electron beam image.

11. The apparatus for inspecting patterns according to claim 2, wherein when the potential of the specimen or the potential of the electrode above the specimen is changed by the potential adjusting means, a setting condition range is set so that the potential is changed from positive to negative.

12. The apparatus for inspecting patterns according to claim 3, wherein when the potential of the specimen or the potential of the electrode above the specimen is changed by the potential adjusting means, a setting condition range is set so that the potential is changed from positive from negative.

13. The apparatus for inspecting patterns according to claim 4, wherein when the potential of the specimen or the potential of the electrode above the specimen is changed by the potential adjusting means, a setting condition range is set so that the potential is changed from positive to negative.

14. The method for inspecting patterns according to claim 7, wherein when the potential of the specimen or the potential of the electrode above the specimen is changed by the potential adjusting means, potential is changed so that a charged condition of the specimen is changed from positive to negative.

* * * * *